(12) United States Patent
Raman et al.

(10) Patent No.: US 11,604,234 B2
(45) Date of Patent: Mar. 14, 2023

(54) BRIDGE SENSOR BIASING AND READOUT SYSTEM

(71) Applicant: Melexis Technologies SA, Bevaix (CH)

(72) Inventors: Johan Raman, Knesselare (BE); Pieter Rombouts, Mariakerke (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 17/523,189

(22) Filed: Nov. 10, 2021

(65) Prior Publication Data

US 2022/0146604 A1    May 12, 2022

(30) Foreign Application Priority Data

Nov. 10, 2020  (EP) ..................................... 20206824

(51) Int. Cl.
  *G01R 33/09*   (2006.01)
  *G01D 5/16*    (2006.01)
  *G01R 15/20*   (2006.01)
  *H03F 3/45*    (2006.01)

(52) U.S. Cl.
  CPC ............. *G01R 33/091* (2013.01); *G01D 5/16* (2013.01); *G01R 15/202* (2013.01); *G01R 33/098* (2013.01); *H03F 3/45076* (2013.01)

(58) Field of Classification Search
  CPC ....... G01R 33/091; G01R 15/202; G01D 5/16
  See application file for complete search history.

(56) References Cited

U.S. PATENT DOCUMENTS

| | | | |
|---|---|---|---|
| 6,657,476 B1 | 12/2003 | Bicking | |
| 10,148,237 B2 | 12/2018 | Raman et al. | |
| 2006/0174711 A1* | 8/2006 | Mori | G01L 9/16 |
| | | | 73/731 |
| 2012/0200290 A1* | 8/2012 | Ausserlechner | H01L 43/065 |
| | | | 324/251 |
| 2016/0377690 A1* | 12/2016 | Huber | G01R 33/07 |
| | | | 702/104 |

(Continued)

FOREIGN PATENT DOCUMENTS

| | | |
|---|---|---|
| EP | 2784521 A1 | 10/2014 |
| EP | 2878927 A1 | 6/2015 |

(Continued)

OTHER PUBLICATIONS

Extended Search Report from corresponding EP Application No. 20206824.3, dated Apr. 23, 2021.

*Primary Examiner* — Alvaro E Fortich
(74) *Attorney, Agent, or Firm* — Workman Nydegger

(57) ABSTRACT

A sensor system for measuring a physical quantity includes: a bridge sensor having at least two terminal pairs, a current source for applying a bias current between the bias terminal pair, resulting in a differential sensor signal on a readout terminal pair, wherein the differential sensor signal is indicative for the physical quantity, and an amplifier comprising a first input node and a second input node for receiving the differential signal and at least one output node, wherein the amplifier is configured for amplifying the differential sensor signal and putting the resulting signal on the at least one output node, wherein the sensor system is configured such that, in operation, the amplifier is powered by at least part of the bias current.

15 Claims, 13 Drawing Sheets

(56) References Cited

U.S. PATENT DOCUMENTS

| | | | |
|---|---|---|---|
| 2017/0261567 A1* | 9/2017 | Cesaretti | H01L 28/20 |
| 2017/0261568 A1* | 9/2017 | Miyoshi | G01R 33/072 |
| 2017/0271399 A1* | 9/2017 | Lee | H01L 43/065 |
| 2018/0247522 A1* | 8/2018 | Motz | G08C 15/02 |
| 2019/0107584 A1* | 4/2019 | Baorda | G01R 33/07 |

FOREIGN PATENT DOCUMENTS

| | | | |
|---|---|---|---|
| EP | 2978131 | A1 | 1/2016 |
| EP | 3396397 | A1 | 10/2018 |
| EP | 3193446 | B1 | 10/2019 |
| EP | 3686558 | A1 | 7/2020 |

* cited by examiner

BRIDGE SENSOR BIASING AND READOUT SYSTEM

FIELD OF THE INVENTION

The present invention relates to sensor systems. More specifically it relates to sensor systems which are using bridge sensors for measuring a physical quantity and which are configured for biasing and reading out of the bridge sensor.

BACKGROUND OF THE INVENTION

Bridge sensors are typically comprising at least two pairs of terminals. The physical quantity is measured by applying a current between the terminals of one pair and by measuring a resulting signal between the terminals of the other pair. The resulting signal is a measure for the physical quantity.

An example of a sensor system comprising a bridge sensor is schematically illustrated in FIG. 1. Such a bridge sensor is biased by applying a voltage or a current to two excitation nodes (one pair of terminals) of the sensor 110. In this example the current is applied using a current source 150. The bridge sensor may be a Hall plate 110. A Hall plate output voltage (or sometimes an output current) is collected from two readout nodes ($V_{H+}$ and $V_{H-}$) of the Hall plate. In the presence of a magnetic field this differential voltage is proportional to the magnetic field. The readout nodes are connected to an amplifier 130, preferably a low-noise amplifier. Typically there is a first stage of amplification (e.g. using a low noise amplifier) as close as possible to the Hall plate. This first stage is the most important stage for the whole noise figure of the sensor.

The nodes for excitation and readout are typically switched. An example thereof is illustrated in FIG. 2 wherein the nodes of the bridge sensor are connected with switching circuitry 210. On the left side, switches 210 are connected with the contact nodes and with the current source 150. Using these switches it is possible to select which nodes are used for applying the bias current or voltage. On the right side, switches 220 are connected with the contact nodes. Using these switches it is possible to select which nodes are the readout nodes for collecting the output voltages ($V_{H+}$ and $V_{H-}$) of the Hall plate.

In some prior art solutions the accuracy of the measurements is increased by applying current spinning. In the current spinning technique, the function of Hall plate nodes (for biasing and readout) are changed in a systematic and highly repetitive way to separate the offsets from the useful magnetic signal. With these repetitive schemes, current spinning provides a form of "chopping" adapted for use in Hall sensors.

These techniques may also be applied in other types of bridge sensors such as pressure sensors or other types of magnetic sensors.

An important common requirement of sensors in general, and of bridge sensors in particular is their power consumption. This is especially the case for sensor systems which comprise a plurality of bridge sensors. When a plurality of bridge sensors needs to be biased and read out simultaneously this results in a significant current consumption, induced by biasing, amplifying and reading out a plurality of bridge sensors simultaneously. For example typically 0.3 mA per bridge sensor may be consumed. In case of 100 bridge sensors which are read out simultaneously this results in a total current of 30 mA. This is a significant current consumption for a small IC.

There is therefore a need for providing good sensor systems which allow biasing and reading out of bridge sensors which have a reduced power consumption.

SUMMARY OF THE INVENTION

It is an object of embodiments of the present invention to provide good sensor systems comprising a bridge sensor and configured for biasing and reading out the bridge sensor.

The above objective is accomplished by a method and device according to the present invention.

Embodiments of the present invention relate to a sensor system for measuring a physical quantity. The sensor system comprises:

a bridge sensor comprising at least two terminal pairs, a current source configured for applying a bias current between the terminals of one of the terminal pairs referred to as a bias terminal pair, resulting in a differential sensor signal on a readout terminal pair (selected from the at least two pair terminals) different from the bias terminal pair, wherein the differential sensor signal is indicative for the physical quantity, and an amplifier comprising a first input node and a second input node for receiving the differential signal and at least one output node, wherein the amplifier is configured for amplifying the differential sensor signal and putting the resulting signal on the at least one output node, wherein the sensor system is configured such that, in operation, the amplifier is powered by at least part of the bias current.

It is an advantage of embodiments of the present invention that the bias current is reused by the amplifier.

It is thereby advantageous that the power consumption of the sensor system is smaller than the power consumption of a sensor system wherein the amplifier and the bridge sensor are in parallel between the power supply and the ground.

In embodiments of the present invention the amplifier comprises a differential transistor pair and, during operation, the bias current is provided at a common mode point of the amplifier.

In embodiments of the present invention the bias current may for example be used by the input differential transistor pair of the (low-noise) amplifier.

In embodiments of the present invention two output nodes are present, a first output node and a second output node, and said differential transistor pair comprises a first resistor between the first input node and the first output node and a second resistor between the second input node and the second output node.

In embodiments of the present invention the amplifier comprises a first part and a second part. The first part is configured for converting the differential sensor signal into a first current and a second current. The difference between the currents is indicative for the differential sensor signal. The second part is configured for generating, from the first current and the second current, an output voltage which is indicative for the physical quantity.

In embodiments of the present invention the sensor system comprises a first voltage level shifter connected between a first terminal of the readout terminal pair and the first input node, a second voltage level shifter connected between a second terminal of the readout terminal pair and the second input node, wherein the voltage level shifters are configured for shifting a voltage level of signals of the readout terminal pair before amplifying the differential signal.

In some embodiments of the present invention, voltage level shifters are not required. Instead, in these embodiments, a simple interconnection of any type of electrical conductor may be used.

In embodiments of the present invention the voltage level shifters are comprising a first capacitor connected between the first input node and the first terminal of the readout terminal pair and a second capacitor connected between the second input node and the second terminal of the readout terminal pair.

In embodiments of the present invention the sensor system comprises:

a first resistor connected between the first input node and a reference voltage or a voltage at the output node of the amplifier, a second resistor connected between the second input node and a reference voltage or a voltage at the output node of the amplifier.

In embodiments of the present invention said sensor system is configured for generating a chopped differential sensor signal, and/or the amplifier comprises choppers for demodulation, and/or the sensor system comprises choppers for demodulating the amplifier output.

In embodiments of the present invention the bridge sensor is a magnetic sensor.

In embodiments of the present invention the magnetic sensor is a magnetic Hall sensor, or a tunnel magnetoresistance bridge arrangement, or a giant magnetoresistance bridge arrangement.

In embodiments of the present invention the bridge sensor is a pressure sensor.

In embodiments of the present invention the bridge source, the current source and the amplifier are integrated in an integrated circuit.

In embodiments of the present invention the sensor system comprises a plurality of bridge sensors, and is configured for biasing the bias terminal pairs of the bridge sensors using the at least one current source and for reading out the readout terminal pairs of the bridge sensors.

In embodiments of the present invention the bridge sensors are arranged in a matrix configuration.

In embodiments of the present invention the sensor system is configured for biasing and reading out the plurality of bridge sensors in parallel or in series. Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
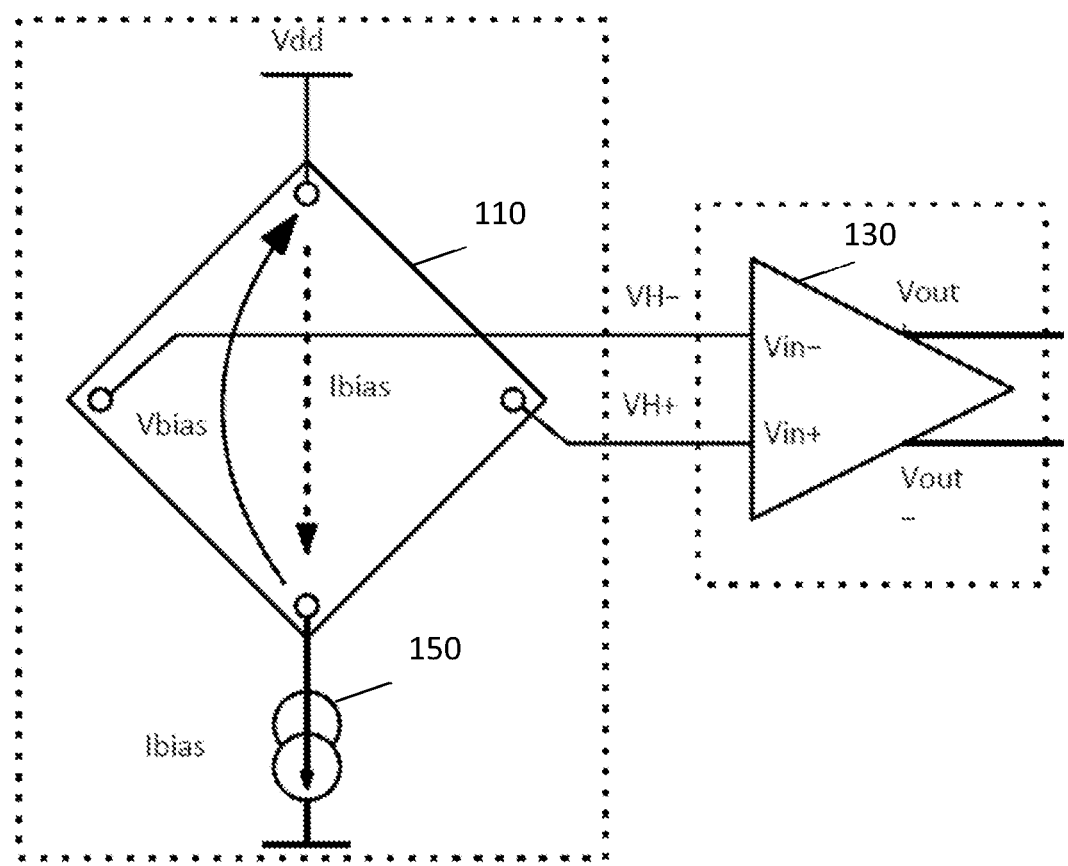
FIG. 1 shows a schematic drawing of a prior art sensor system comprising a bridge sensor.
Figure 2:
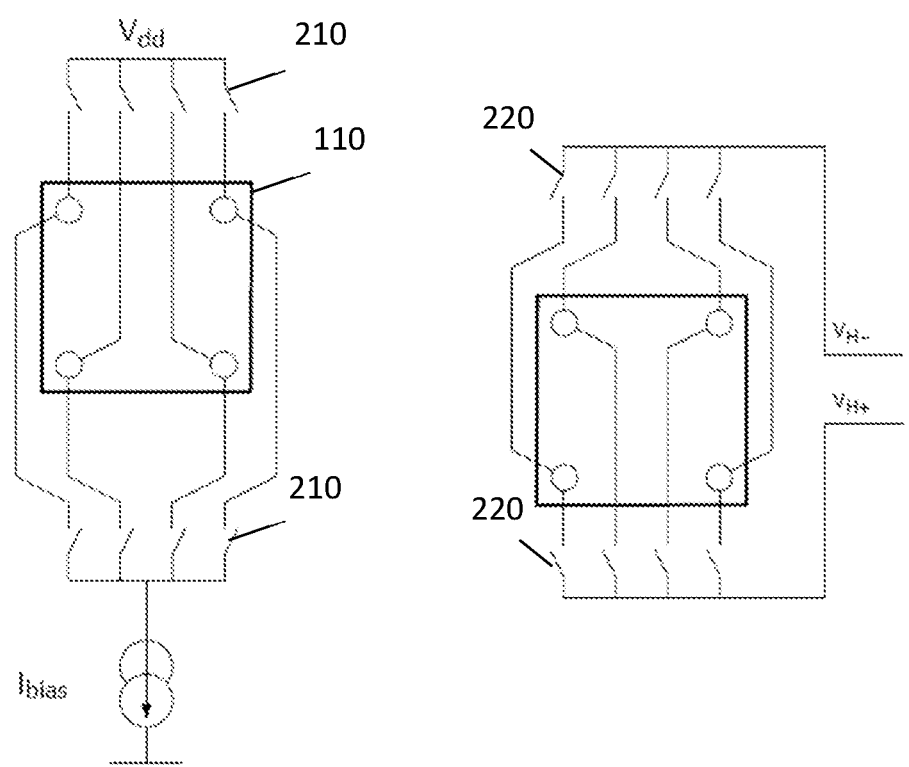
FIG. 2 shows a schematic drawing of a prior art sensor system comprising circuitry for appropriately connecting the terminal pairs of the bridge sensor for biasing and reading out the bridge sensor.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention relate to a sensor system 100 for measuring a physical quantity. The sensor system comprises a bridge sensor 110 which comprises at least two terminal pairs.

The sensor system, moreover, comprises a current source 150 configured for applying a bias current between the terminals 111, 112 of one of the terminal pairs. These terminals are referred to as the bias terminal pair. Another terminal pair 113, 114 different from the bias terminal pair is referred to as the readout terminal pair.

The biasing and readout terminal pairs are selected such that by applying a bias current between the nodes of the biasing terminal pair, a differential sensor signal is generated over the readout terminal pair, wherein the differential sensor signal is indicative for the physical quantity to be measured.

The bridge sensor 100, moreover, comprises an amplifier 120 for amplifying the differential voltage signal over readout terminal pair.

The bridge sensor 100, moreover, comprises an amplifier 120 comprising two input nodes 121, 122 for receiving the differential sensor signal and at least one output node 123. The amplifier 120 is configured for amplifying the differential sensor signal and for putting the resulting signal on the at least one output node 123, 124.

The sensor system 100, moreover, is configured such that, in operation, the amplifier 120 is powered by at least part of the bias current. It is an advantage of embodiments of the present invention that the input differential pair of the low-noise amplifier, e.g. a low-noise transconductance, can be operated by reusing the bias current of the bridge sensor.

In embodiments of the present invention the sensor system comprises a power supply node and a ground node. In operation the supply voltage applied to the supply voltage node may for example range between 0.8 and 12 V. The supply voltage typically depends on the technology node in which a device is integrated. The supply voltage may for example be 3.3V, which is a typical value for 0.35 micrometer technologies, or finer technologies which provide devices that can operate in different voltage domains. The amplifier and the bridge sensor are connected in series between the power supply node and the ground node such that, in operation, at least part of the bias current of the bridge sensor also goes through the amplifier. In embodiments of the present invention, more in particular, the first stage of amplification may be put in series with the current biasing of the bridge sensor (e.g. Hall plate). Hence the biasing current of the bridge sensor is recycled to supply the first amplification stage. This will result in a decreased current consumption. For example, in case of a Hall plate, instead of two times 0.3 mA (for the biasing and for the amplification), only 0.3 mA is consumed when applying the same bias voltage. Hence, the power consumption is approximately divided by 2. In such a configuration the voltage drop over the Hall plate can still be—a substantial fraction of the supply voltage, e.g. half of the supply voltage, 75% of the supply voltage, or even more.

As indicated above the bridge sensor may be a Hall plate. This may for be a horizontal or vertical Hall plate.

The bridge sensor may comprise a plurality of contacts which are connected with the terminals. The contacts may for example form the contact with the sensor itself (e.g. with the underlying semiconductor material), whereas the terminals are connecting the bridge sensor with external devices. The number of contacts may for example be 4, or 5, or 6, or even more. Contact terminals may be present on the contacts. In some embodiments one terminal may be connected to one or more contacts. In some embodiments there may be a one to one relation between the contacts and the terminals.

The bridge sensor may for example be a vertical Hall plate for which the contacts are arranged inline. For example 5 contacts may be provided which are arranged inline in the following order C1, C2, C3, C4, C5. The outer contacts C1 and C5 may be connected together to the terminal T1, and the terminals T2, T3, and T4 are respectively connected with the contacts C2, C3, and C4. T1 and T3 may form the biasing terminals while T2 and T4 are the read out terminals (differential signal).

In embodiments of the present invention the amplifier 120 may be a low noise amplifier.

Figure 3:
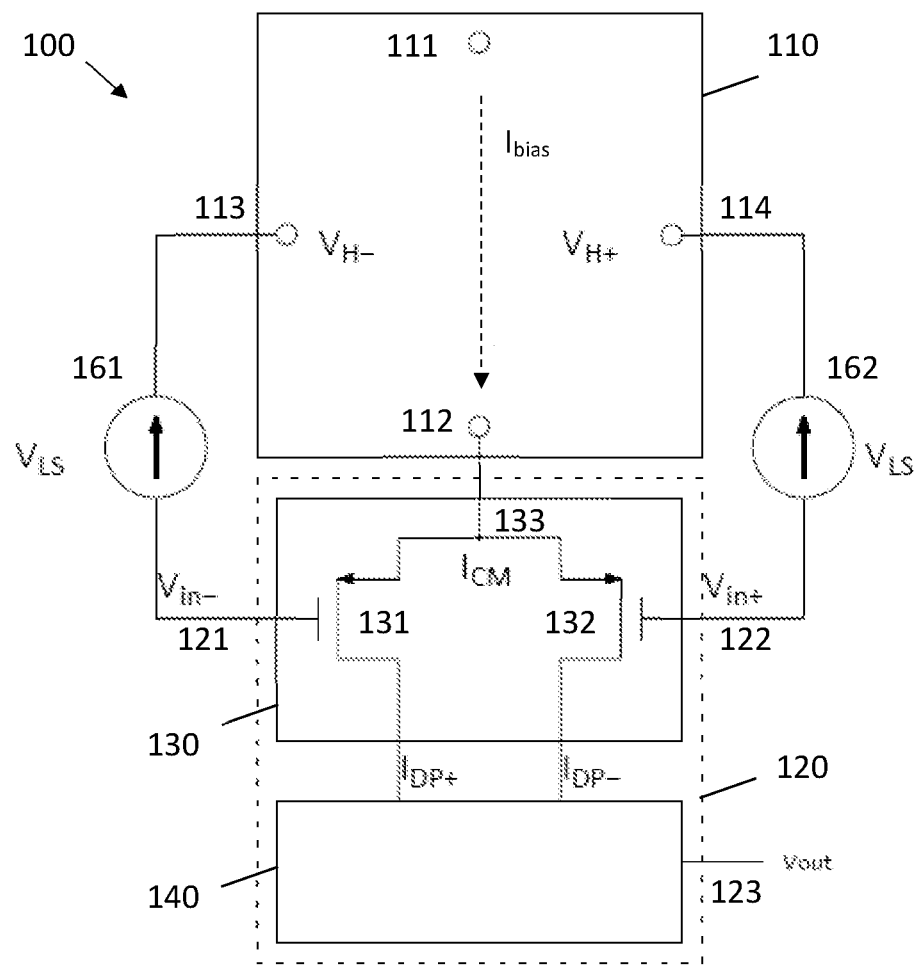
FIG. 3 shows a schematic drawing of a sensor system in accordance with embodiments of the present invention.

In the example illustrated in FIG. 3 the biasing current $I_{bias}$ is applied between two opposite terminals 111, 112 of the bridge sensor 110 and the readout terminal pair is the other pair of opposite terminals 113, 114. On this other pair the differential sensor signal ($V_{H+}$ and $V_{H-}$) is induced.

In the example illustrated in FIG. 3 the amplifier 120 is connected in series with the bridge sensor 110 such that the bias current also flows through the amplifier. The amplifier has two input nodes ($V_{in+}$ and $V_{in-}$).

In embodiments of the present invention the amplifier comprises a differential transistor pair 131, 132 and the bias current is provided at a common mode point ($I_{CM}$) of the amplifier.

In embodiments of the present invention the amplifier comprises a first part 130 and a second part 140.

The first part 130 is configured for converting the differential sensor signal into a first current and a second current ($I_{DP+}$ and $I_{DP-}$) wherein the difference between the currents is indicative for the differential sensor signal.

The second part 140 is configured for generating, from the first current and the second current, an output voltage ($V_{out}$) which is indicative for the physical quantity in a frequency band of interest. The frequency band of interest depends on the application for which the sensor system is intended. For example, a sensor system used for doing a galvanically isolated measurement of a current by means of contactless sensing the magnetic field generated by this current may have a frequency band of interest going from DC to 200 kHz. Another example is the Hall based readout of immunoassays. In such an example readout times in the order of 120 ms may be used (for a single readout) In that case the frequency range of interest for such an application is less than 5 Hz.

This is also illustrated in FIG. 3. The sources of the transistors 132, 133 of the transistor pair are connected at the common mode point with a biasing terminal of the bridge sensor and the drains of the transistors are connected with the second part 140.

In embodiments of the present invention the sensor system 100 comprises:

a first voltage level shifter 161 connected between a first terminal 113 of the readout terminal pair and the first input node 121, a second voltage level shifter 162 connected between a second terminal 114 of the readout terminal pair and the second input node 122.

The voltage level shifters 161, 162 are configured for shifting a voltage level of signals of the readout terminal pair before amplifying the differential signal.

Also this is illustrated in FIG. 3. The first voltage level shifter 161 is connected between the first terminal 113 of the readout terminal pair and the gate of the first transistor 131 of the differential pair. The second voltage level shifter 162 is connected between the second terminal 114 of the readout terminal pair and the gate of the second transistor 132 of the differential pair.

The voltage at the common mode point between the bridge sensor and the differential pair may for example be approximately 1V. The common mode voltage of the readout terminal pair may for example be approximately 2V. As it is for most types of active devices not possible to drive the gate (or base) of a transistor, of the transistor pair, with 2 volts while its upper point (at the source side) is 1V without losing operation as a differential pair, the level shifters are introduced in order to shift the common mode voltage of the readout terminal pair to the common mode voltage of the differential pair. This is the case for most PMOS devices, as well as for PNP bipolar transistors.

Figure 15:
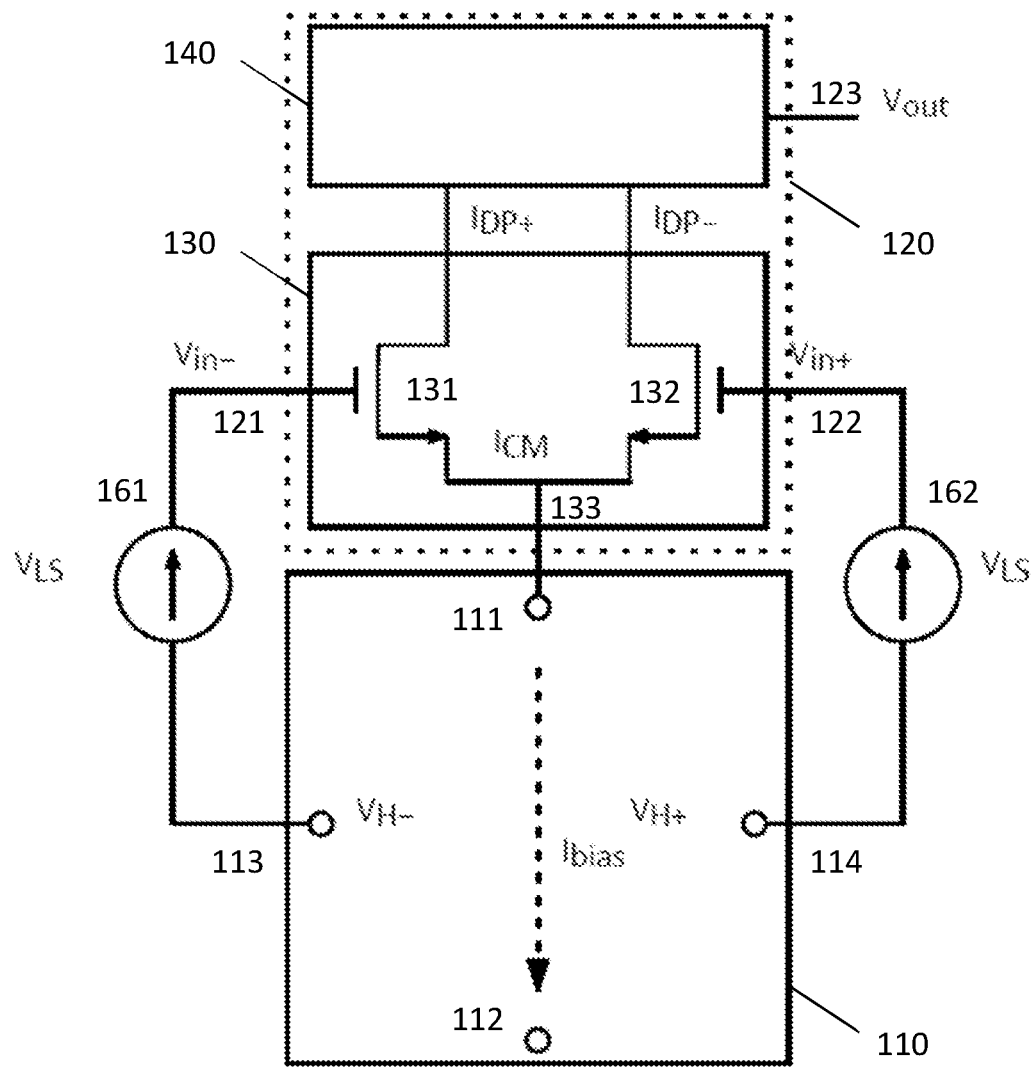
FIG. 15 shows a schematic drawing of a sensor system in accordance with embodiments of the present invention.

In the exemplary embodiment illustrated in FIG. 3 the amplifier and the bridge sensor are connected in series between the power supply node and the ground node. In this example the bridge sensor is on top (i.e. closest to the power supply) and the amplifier is below (i.e. closest to the ground). The invention is, however, not limited thereto. In alternative embodiments of the present invention the bridge sensor may be below (i.e. closest to the ground) and the amplifier on top (i.e. closest to the power supply). For example an NMOS differential pair may be used when the differential pair is on top. Similar arguments, as those when the bridge sensor is on top, apply to NMOS devices and NPN bipolar transistors when the differential pair is above the bridge sensor. FIG. 15 shows a schematic drawing of an exemplary sensor system, in accordance with embodiments of the present invention where the amplifier 120 is closest to the power supply and the bridge sensor 110 is closest to ground. Note that in FIG. 3 the bridge sensor is not shown to be connected to VDD. In some embodiments the bridge sensor may be connected to VDD. This is, however, not strictly required. In some embodiments a further element can be between the power rail and the bridge sensor. Similarly, in FIG. 15 the bridge sensor is not shown to be connected to ground. The bridge sensor in this example may be connected to ground. This is, however, not strictly required. A further element may be connected between the bridge sensor and the ground.

In embodiments of the present invention the active devices used in the differential pair may allow operation at gate (or base) voltages that have a common-mode voltage different from the common mode level of the source (or emitter). In such cases, the voltage level shifters can be a simple interconnection by means of any type of conductor. This is for instance the case for depletion-mode MOSFET devices, which are devices that are doped so that a channel exists even with zero voltage from gate to source. To control the channel of such an n-channel device, a negative voltage needs to be applied to the gate relative to the source, depleting the channel, which reduces the current flow through the device. Equivalently, for a p-channel device a positive voltage needs to be applied relative to the source.

Figure 4:
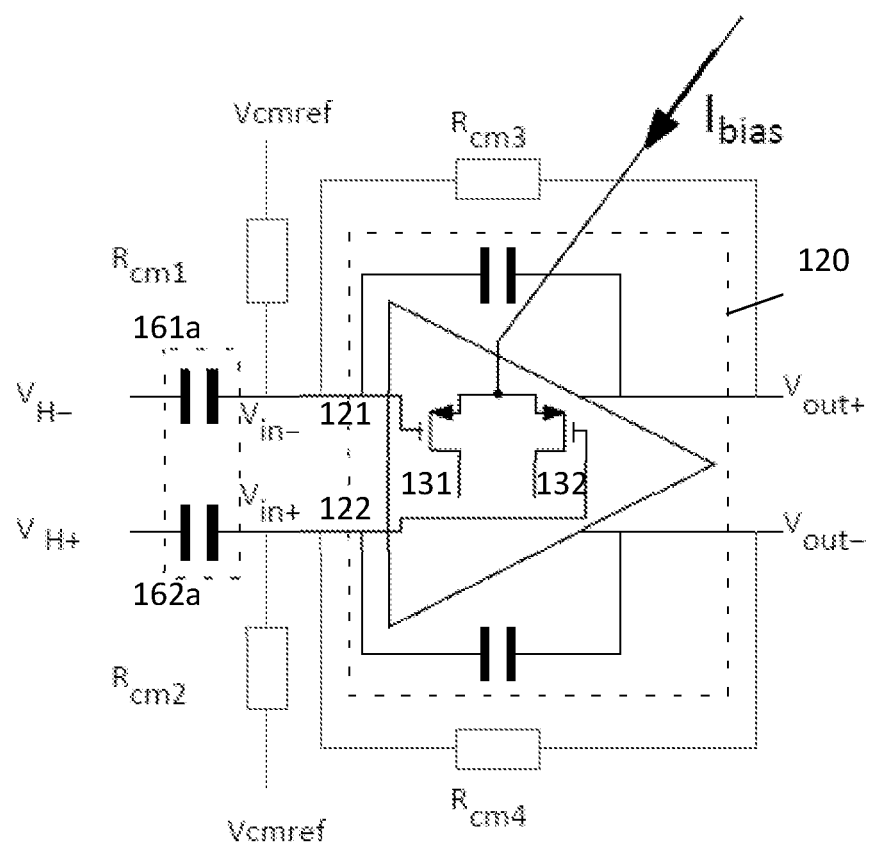
FIG. 4 shows a schematic drawing of an amplifier and its connections of a sensor system in accordance with embodiments of the present invention.

In embodiments of the present invention the voltage level shifters 161, 162 are capacitive level shifters. This is illustrated in FIG. 4 where the level shifters are comprising a first capacitor 161a connected between the first input node 121 of the amplifier 120 and the first terminal 113 of the readout terminal pair and a second capacitor 162b connected between the second input node 122 of the amplifier 120 and the second terminal 114 of the readout terminal pair. In this example VH+ is the positive differential voltage and VH– is the negative differential voltage from the bridge sensor. Vin+ is the shifted positive differential voltage and Vin– is the shifted negative differential voltage. This capacitive implementation is only one exemplary implementation of an AC level shifter. The invention is, however, not limited thereto. For example, also DC level shifters may be used.

In embodiments of the present invention the sensor system 100 comprises a first resistor Rcm1 connected between the first input node 121 and a reference voltage Vcmref or a voltage at the output node of the amplifier 120 and a second resistor Rcm2 connected between the second input node 122 and a reference voltage Vcmref or a voltage at the output node of the amplifier. An example thereof is also illustrated in FIG. 4. In the example of FIG. 4 the common mode voltage at the input of the amplifier is set to the reference voltage using the first resistor and the second resistor.

It is an advantage of such embodiments that the common-mode level at the input nodes 121, 122 is defined by a (preferably large) resistance which is either connected to a reference voltage Vcmref via two resistances (Rcm1 and_Rcm2) or to the amplifier output nodes via two resistances (Rcm3 and Rcm4). In the former case, the reference voltage Vcmref is chosen to arrive at a common-mode voltage level at the gates of the input differential pair which allows operating the input transistors in the so called saturation region. In the latter case the common-mode at the amplifier output is "copied" to the input nodes.

In embodiments of the present invention the differential pair 131, 132 may comprise a first resistor Rcm3 between the first input node 121 and the first output node 123 and a second resistor Rcm4 between the second input node 122 and the second output node 124. An example thereof is illustrated in FIG. 4.

A large number of amplifier circuits are known in the art. The amplifier may for example be based on any of the embodiments disclosed in the Melexis patent "Low noise amplifier circuit" EP3193446B1 and U.S. Ser. No. 10/148,237B2.

Current spinning may be applied. The terminals of the bridge sensor may thereby be exchanged such that they change from biasing to readout terminals and vice versa. Alternatively, the bridge sensor may comprise more than four nodes, where switches are used to select two biasing and two readout nodes out of the multitude of nodes. Thus, a sensor system 100 may be obtained which is configured for generating a chopped differential sensor signal.

Figure 5:
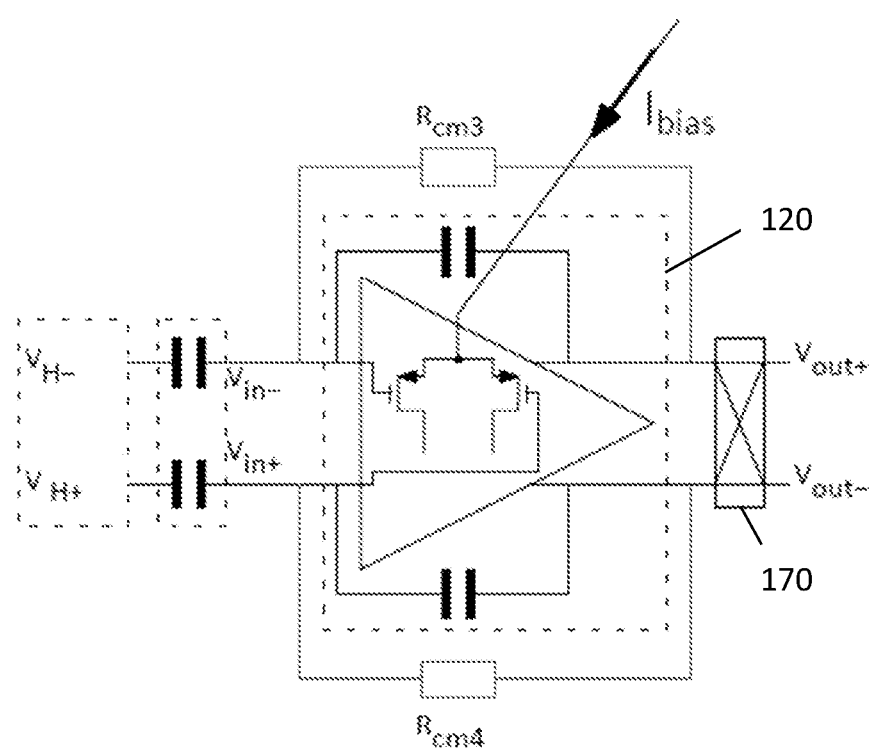
FIG. 5 shows a schematic drawing of an amplifier and its connections, including a chopper connected with the output nodes of the amplifier, of a sensor system in accordance with embodiments of the present invention.

In embodiments of the present invention the sensor system 100 may comprise choppers 170 for demodulating the amplifier output. An example of such a chopper 170 is illustrated in FIG. 5. The chopper 170 is connected with the output nodes of the amplifier 120. When a chopped sensor signal $V_{H-}$, $V_{H+}$ is applied at the input nodes of the amplifier 120 this can be demodulated by the chopper 170.

Figure 6:
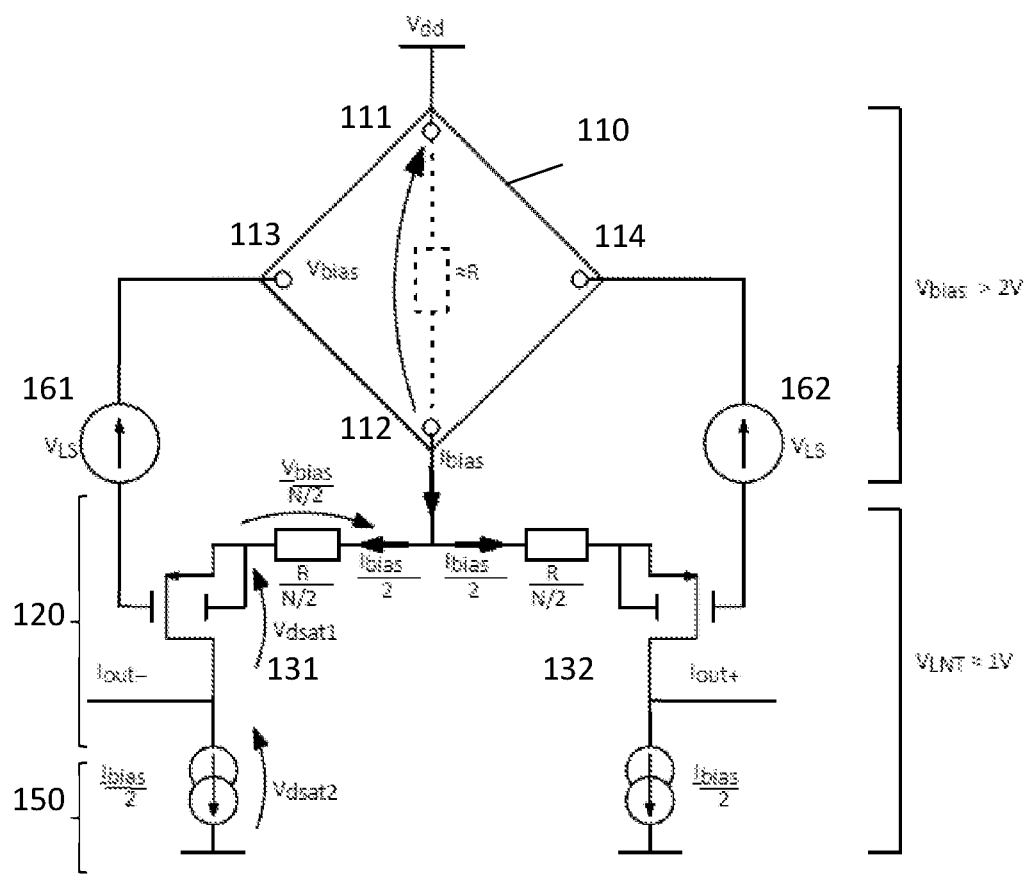
FIG. 6 shows a schematic drawing of a sensor system in accordance with embodiments of the present invention.

In the exemplary embodiment of the present invention illustrated in FIG. 6 the bridge sensor 110 (e.g. Hall plate) is at the top side connected to Vdd and the input differential pair 131, 132 of the amplifier is at lower voltages. The amplifier 120 may be a low noise transconductance (LNT) amplifier. The tail current source 150 of the differential transistor pair is replaced with the bridge sensor. Hence, the differential transistor pair receives the bias current of the bridge sensor at a common-mode point. The differential transistor pair consists of two nominally matched PMOS transistors 131, 132. Preferably the bulk of each transistor of the differential transistor pair is connected to its source (to neutralize bulk effects), but this is not mandatory. The bulk can for example be connected to a common-mode point, the supply voltage (typically for PMOS transistors) or to the ground (typically for NMOS transistors).

In FIG. 6 the current $I_{bias}$ through the bridge sensor also goes through the differential transistor pair which is connected to the readout terminals 113, 114 (also referred to as readout terminals). The drains of the transistors of the differential transistor pair are connected with a current source. Each current source 150 draws a current Ibias/2. Thus the total current through the bridge sensor(s) is equal to Ibias.

In this exemplary embodiment of the present invention the first stage amplifier 120 does a voltage to current conversion meaning that in case there is a differential voltage on the readout terminals this will result in a differential current iout+ and iout− at the output of the differential transistor pair. The invention is, however, not limited thereto. The first stage amplifier may for example also implement a voltage amplification (i.e. voltage difference in, amplified voltage difference out).

In the exemplary embodiment of the present invention illustrated in FIG. 6, source degeneration resistors can be used. A first regenerator resistor (R/(N/2)) is connected between the source side of the first transistor 131 and the second terminal of the bias terminal pair and a second generator resistor 132 is connected between the source side of the second transistor and the second terminal of the bias terminal pair. The regenerator resistors may have a resistance level substantially below the resistance of the bridge sensor, for instance of the order R/(N/2) with R representing the resistance of the bridge sensor between two diagonal terminals and N a scale factor which is, for instance, at least 4, preferably larger. The voltage drop Vbias/(N/2) over these degeneration resistors, which incurs some loss of voltage headroom, is then relatively small compared to the bias voltage.

The degeneration resistors do not have to be well matched with the Hall plate resistance R. The example of R/(N/2) is merely to point out that the resistance is well below the Hall plate/bridge sensor resistance.

The drain sides of the differential pair transistors 131, 132 provide two current outputs of the LNT.

In this exemplary embodiment of the present invention two fixed current sources are added to change the common-mode current level of the output currents. The common-mode level can for instance be shifted to zero by means of two fixed current sources of magnitude Ibias/2.

The output nodes (the readout terminal pair) of the bridge sensor(s) (e.g. Hall plate(s)) 110 may be connected to the input nodes of the differential transistor pair via two voltage level-shifters (VLS) 161, 162. These thus transfer the bridge sensor signal to the LNT input.

When the transconductance of the differential pair transistors is large enough, they act as source followers that copy/force the differential input voltage over the two degeneration resistors shown in the figure. The differential output current is then determined from this voltage and the total series resistance of the degeneration resistors.

Figure 7:
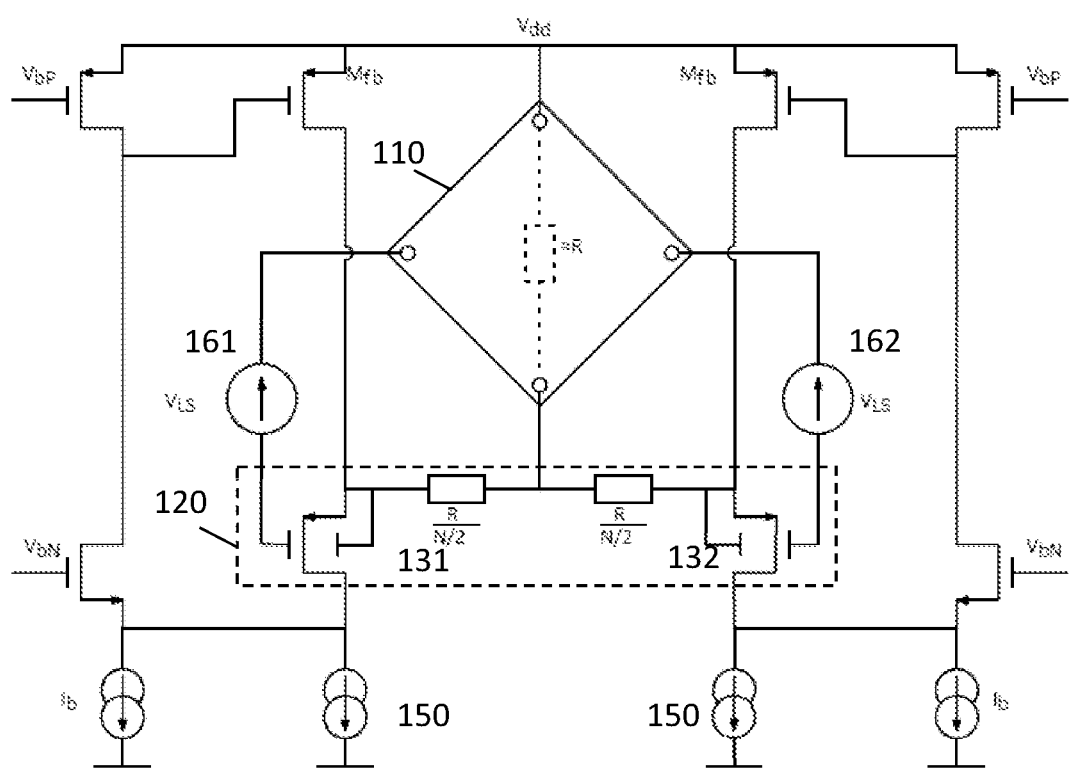
FIG. 7 shows a schematic drawing of a sensor system building upon the sensor system in FIG. 6, but with super source followers, in accordance with embodiments of the present invention.

In embodiments of the present invention the effective transconductance of the differential pair transistors 131, 132 may be boosted by converting the source follower action of the MOSFETs into so called super-source followers. An illustrative embodiment building upon FIG. 6, but now with super source followers is illustrated in the schematic drawing in FIG. 7.

Note that the output currents can be collected at a reduced common-mode voltage level by means of folding cascodes.

In this exemplary embodiment of the present invention the differential output current is amplified and then fed back to the source nodes of the differential pair via the transistors indicated as Mfb. With sufficient gain in this loop, the signal current due to the sensor readout (e.g. Hall) voltage will be forced to flow in Mfb. By extending the Mfb as current mirrors (not shown in the figure), it is easy to derive (scaled) currents that form the output currents of the LNT. The drains of each Mfb transistor is connected with the source of the corresponding transistor 131, 132 of the differential terminal pair. An advantage of the use of cascode transistors as detailed above is that this reduces the input capacitance of the differential transistor pair 131, 132.

Without these cascode transistors, the parasitic capacitance between the input and the drain of the input transistors can be greatly increased by the Miller effect. The cascode transistors greatly reduce the gain associated with this Miller effect.

An advantage of the use of such a super source-follower configuration is that the voltage transfer between gate and source improves substantially. An improved voltage-follower characteristic results in bootstrapping of the parasitic gate-to-source capacitance of the input transistors, again reducing the input capacitance of the amplifier.

In this, VbN is a reference voltage that defines the constant gate voltage of the cascode transistors. VbP is the gate bias voltage of the upper PMOS transistors which are operated in the saturation region (i.e. as a current source). This voltage can be derived from a standard bias circuit that sets the nominal current in these PMOS transistors to a known value. The other current sources indicated on the figure can be realized with NMOS transistors operated in the saturation region. The current sources indicated as Ib represent a current generated by such an NMOS transistor. The magnitude of the current Ib may be nominally equal to the current in the PMOS current sources set by VbP, but this is not required.

A sensor system, according to embodiments of the present invention, may be integrated in an integrated circuit. For example the current source and the amplifier and the level shifters may be integrated together in an integrated circuit.

The above improvements that reduce the input capacitance of the amplifier imply that the level-shifter capacitances can be sized smaller, leading to substantial savings in silicon area when the technique is used in integrated circuits.

Figure 8:
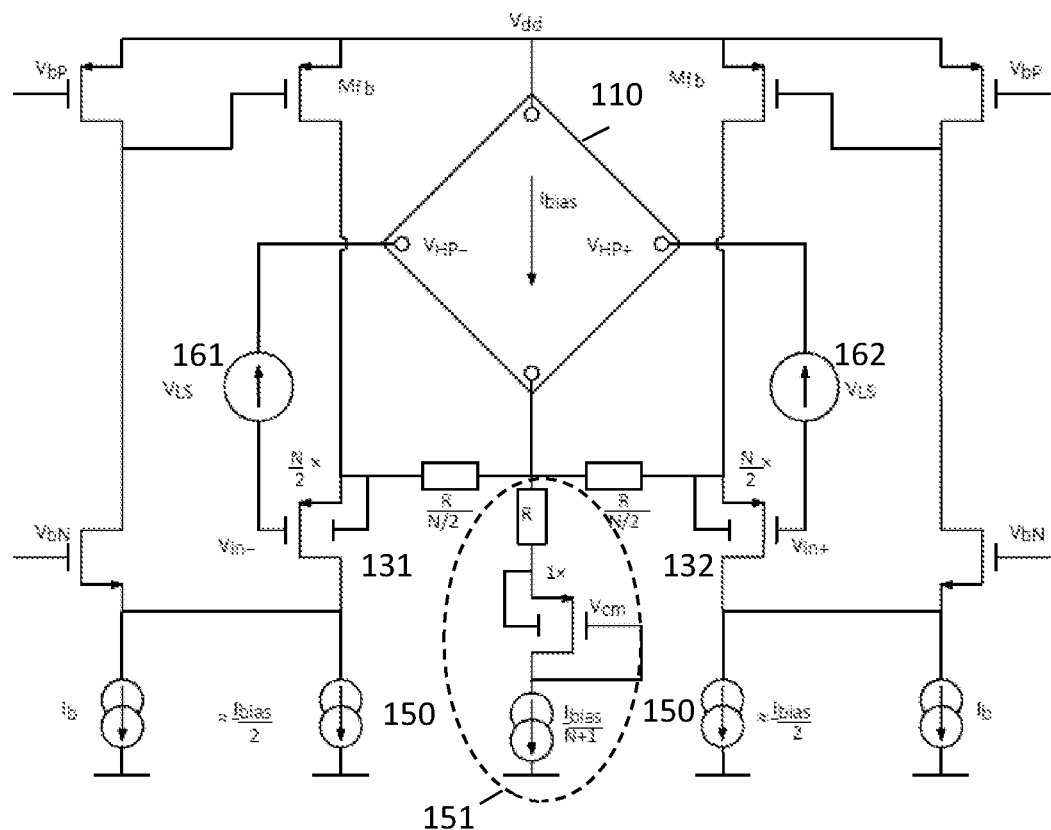
FIG. 8 shows a more detailed exemplary embodiment of a sensor system in accordance with embodiments of the present invention.
Figure 9:
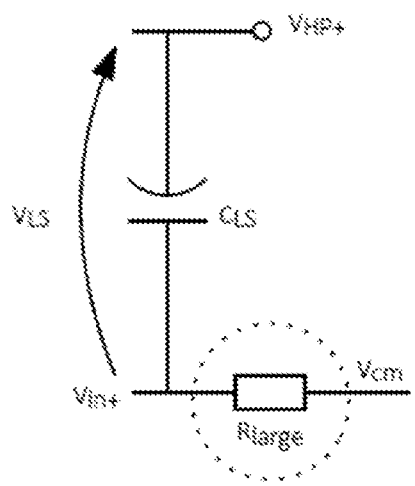
FIGS. 9 and 10 show implementation examples of a level shifter in accordance with embodiments of the present invention.
Figure 10:
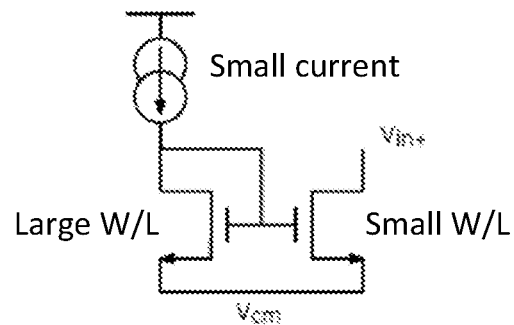

In FIGS. 8, 9 and 10 a more detailed embodiment is illustrated which includes control of the bias current and how to make a voltage level shifter by means of a capacitor. FIG. 8 shows the same scheme as the scheme in FIG. 7 with an indication of the currents and voltages on different parts of the scheme. The voltage level Vcm which defines the common-mode input voltage of the input differential pair, e.g. by making use of a preferably large resistance $R_{large}$ as in FIG. 9, may be derived by a bias circuit 151 as indicated on FIG. 8.

FIG. 8 shows an exemplary schematic drawing of a level shifter in accordance with embodiments of the present invention. The use of a capacitor between a readout node of the bridge sensor and an input node of the amplifier for this purpose is advantageous because it does not by itself introduce extra noise. The capacitance preferably is significantly larger than the parasitic capacitances at the input nodes 121, 122, e.g. the capacitance at the gate of an input transistor.

In order to set the right DC common-mode level at the input of the differential transistor pair, large resistors $R_{large}$ can be used to slowly "leak" charge to/from these input nodes. These resistors may be present between the input node of the amplifier and the common mode point (see FIG. 8). The resistance of these resistors may for example range between 1MΩ and 1TΩ.

The resistors can be real resistors, but can also be "pseudo resistors", e.g. obtained by operating a MOSFET in its linear region. By appropriate sizing (see indications on FIG. 10) a pseudo resistor with large equivalent resistance can be obtained. A small current may be on the order of 100 nA up to as low as 1 pA. The transistor on the left side has a large W/L, e.g. between 10 up to even 1000, where L is typical near the minimum value allowed by the technology. The transistor on the right side will have a small W but large L, leading to W/L values on the order of 1/10, 1/100, or even lower.

In the above embodiments the Ibias/2 current sources 150 at the bottom are fixed current sources. In contrast to the PMOS input transistors, the current source transistors do not contribute any transconductance.

In embodiments of the present invention the sizing of the current source may be done in such a way that the contribution of the current source to the noise is below the contribution of the input transistors to the noise.

FIGS. 11 to 14 schematically illustrate exemplary embodiments of the present invention which are configured using a double reuse scheme. In a double reuse scheme the fixed current source used in each branch of the differential transistor pair is activated to let them contribute to the overall transconductance as well.

In one embodiment with double reuse, the fixed current sources 150 are replaced by a differential transistor pair. For the embodiment shown in FIGS. 11 and 12, this is an NMOS differential pair, which provides extra transconductance that adjoins the already present PMOS differential pair.

Figure 11:
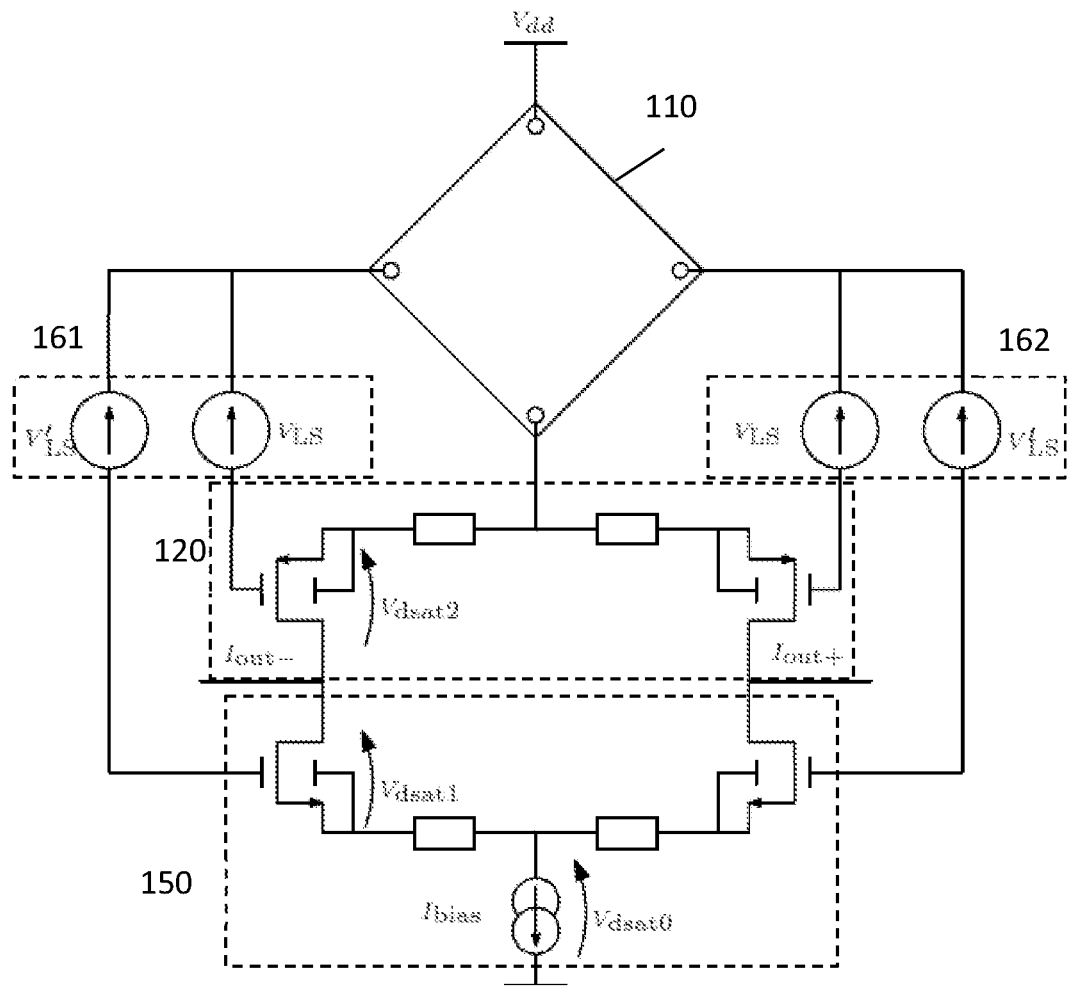
FIGS. 11 to 13 schematically illustrate exemplary embodiments of the present invention which are configured using a double reuse scheme.

The extra differential transistor pair can be operated with a fixed tail current source, as indicated in FIG. 11. The circuit can then operate for a certain range of common-mode voltage levels at the input of the NMOS pair.

Figure 12:
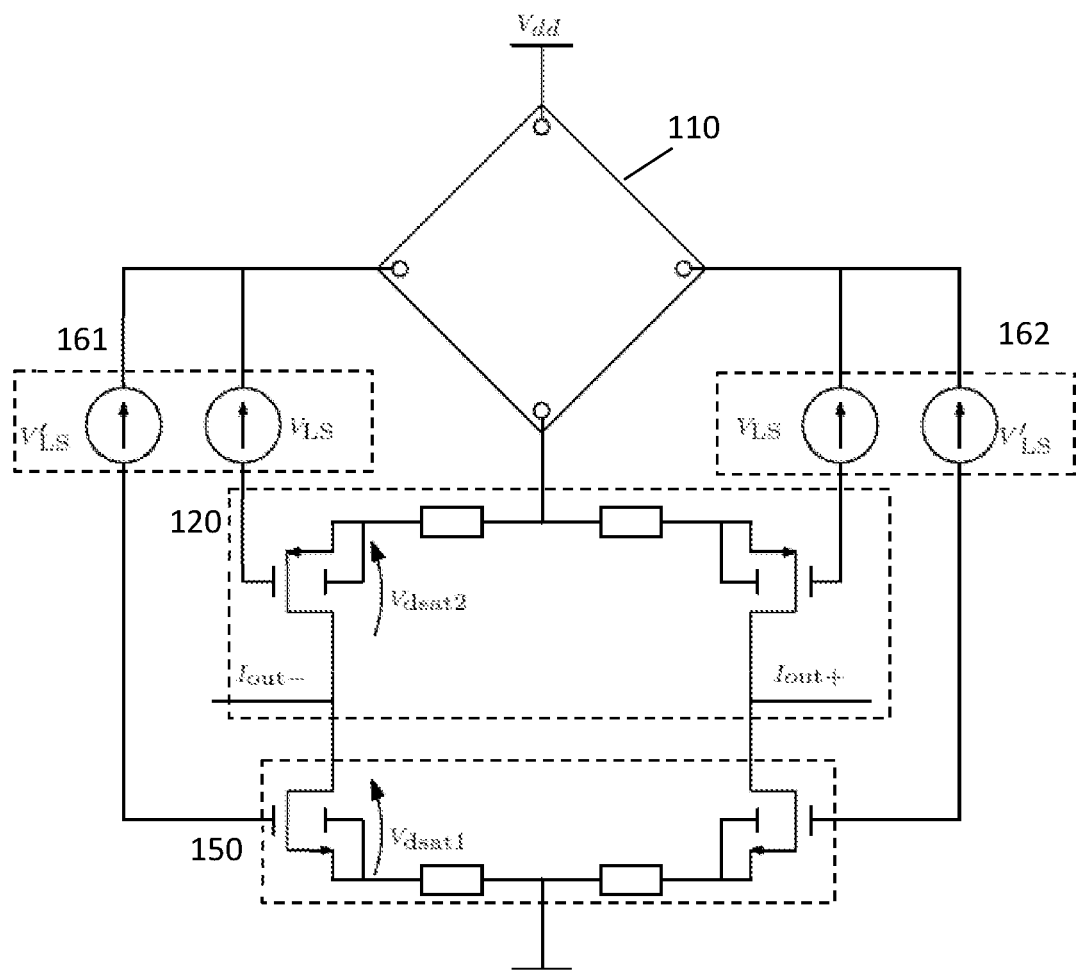

The extra differential transistor pair can also be operated in a "pseudo-differential" way, as shown in FIG. 12. In that case, the common-mode voltage level needs to be adapted such that the total current through the extra differential transistor pair matches with the current reused in the first differential transistor pair, or vice versa.

In the above embodiments with double reuse, the total current through the NMOS differential pair and the total current through the PMOS differential pair may be made equal by means of a common-mode feedback loop that fixes the common-mode voltage at the current outputs, i.e. a feedback loop that forces:

$$\frac{V(I_{out+}) + V(I_{out-})}{2} = V_{cmref}.$$

Figure 13:
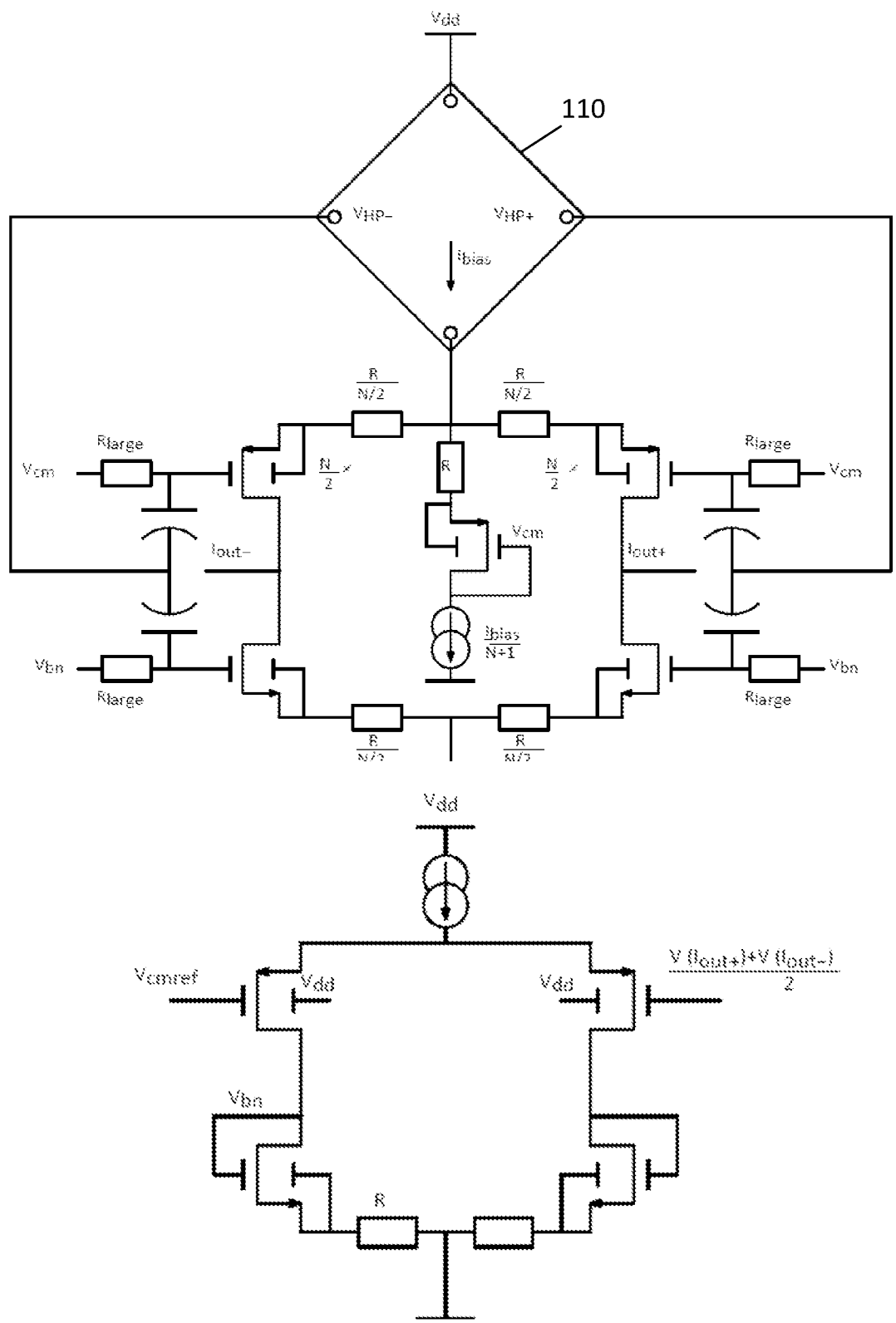

A more detailed embodiment including the common-mode feedback loop is shown in FIG. 13. It is important to note that the NMOS differential pair carries a significant fraction of the current that also flows through the sensor structure. The function of the resistors Rlarge, of the resistor R, of the capacitors, and of the current source Ibias/(N+1), is to set the common mode of the amplifier inputs to Vcm and transfer the (AC) differential Hall signal to the input of the amplifier. The Vbn voltage in the top schematic of FIG. 13 is a voltage that comes out of the common-mode feedback circuit illustrated by the bottom schematic of FIG. 13.

MOSFET-type coupling capacitors may be used. The design may be such that these capacitors have about the same area as the area of the corresponding input transistor (these are the transistors of the differential transistor pair).

A linear region high-R MOSFET (>1000MΩ) may be used to set the DC level.

In an exemplary embodiment of the present invention Vdd may for example be 3.3V, N may be equal to 40, and Ib may be 2.5 μA.

In case of a Hall plate, the operation conditions of the Hall plate may be: a bias current of about 300 μA and a bias voltage of about 2.4V. The voltage headroom for the differential pair/low-noise transconductor (LNT) may be 900 mV.

In embodiments of the present invention the amplifier is preferably a low noise amplifier. The white noise floor may for example be 50 nV/√Hz or below, for example around 11 nV/√Hz, or for example around 3 nV/√Hz. In embodiments of the present invention the noise levels are coupled to the Hall plate characteristics. If one would, for example, have a Hall plate with 1 kΩ resistance, its noise would be around 4nV/√Hz. However, for the same bias voltage of the Hall plate, there will be 8 times more current to reuse. This means that also the noise of the LNT can be scaled down with a factor sqrt(8).

Figure 14:
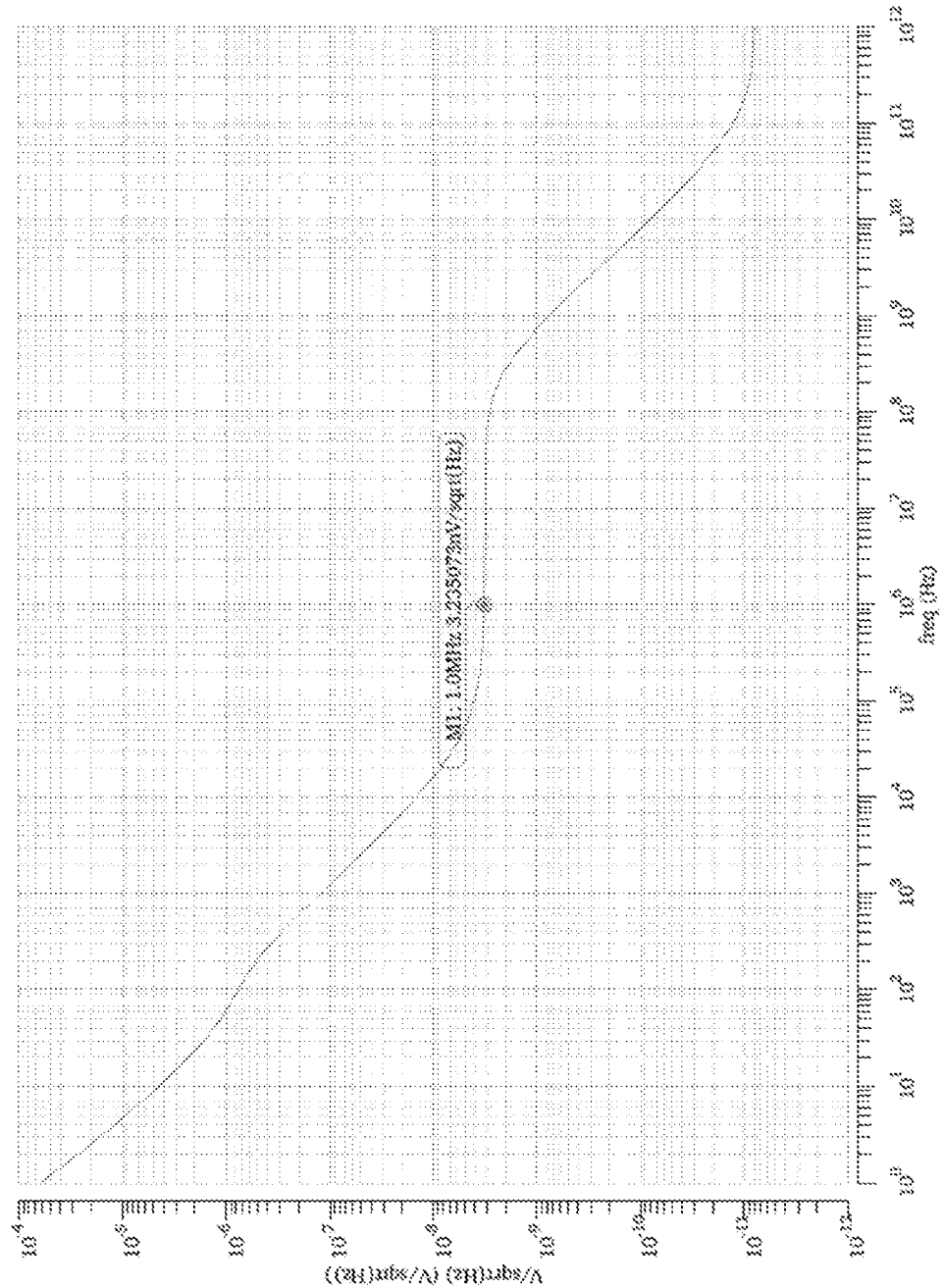
FIG. 14 shows the noise response in function of the frequency for a low noise transconductance amplifier in accordance with embodiments of the present invention.

FIG. 14 shows the noise response in function of the frequency for a LNT in accordance with embodiments of the present invention. In this example the noise floor is substantially below the 11 nV/√Hz noise floor of an exemplary Hall plate. In embodiments of the present invention the noise floor requirements of the amplifier may be relaxed to a value closer to the inherent noise level of the Hall plate.

The embodiments with double reuse can be converted into an additional configuration with single reuse. For instance, in the above explained embodiments with double reuse the input of the PMOS differential pair could be at a fixed common mode level (making the differential input voltage zero). In that case there is no need for the level shifters indicated as VLS. The PMOS differential pair is then basically only used to split the bias current supplied at its central common-mode point into two equal parts, and the transconductance is solely realized by the NMOS transistors of the differential pair at the bottom.

A sensor system according to embodiments of the present invention may comprise a plurality of bridge sensors. The bridge sensors may for example be Hall sensor plates. The bridge sensors may for example be arranged in an array of 3×3 or even more, such as 10×10 or even more bridge sensors. Using such an array configuration for example a magnetic camera may be made. The bridge sensors not necessarily need to be arranged in an array. The number of bridge sensors may for example be any number between 2 or 100, or even more than 100 bridge sensors.

In embodiments of the present invention the plurality of bridge sensors may be biased in parallel through a number of biasing terminal pairs which are connected in parallel, and readout in parallel through a number of readout terminal pairs which are connected in parallel. In embodiments of the present invention the plurality of bridge sensors may be biased in series via the outer terminals of a number of biasing terminal pairs which are connected in series, and readout in series via the outer terminals of a number of readout terminal pairs which are connected in series. By doing so sensor pods can be created. These sensor pods may for example include 4 bridges creating a pod.

In embodiments of the present invention the bridge sensor comprises a switching circuit such that one pair of the terminals can be biased and such that the other pair of the terminals can be read out. Reading may be done by amplifying the differential signal on the readout terminals and by digitizing the amplified signal using an AD converter. In embodiments of the present invention the digitized signal may be processed using a processing device such as a micro-processor, a digital signal processor, a field programmable gate array, etcetera.

In embodiments of the present invention the bridge sensor may be a Hall plate, a magnetoresistance sensor (XMR sensor), or a pressure sensor. In the first two the physical quantity to be measured is a magnetic field, in the latter one the physical quantity to be measured is a pressure. The XMR sensor may for example be a tunnel magnetoresistance of a giant magnetoresistance sensor.

The invention claimed is:

1. A sensor system for measuring a physical quantity, the sensor system comprising:
a bridge sensor comprising at least two terminal pairs,
a current source configured for applying a bias current between the terminals of one of the terminal pairs referred to as a bias terminal pair,
resulting in a differential sensor signal on a readout terminal pair different from the bias terminal pair, wherein the differential sensor signal is indicative for the physical quantity, and
an amplifier comprising a first input node and a second input node for receiving the differential signal and at least one output node, wherein the amplifier is configured for amplifying the differential sensor signal and putting the resulting signal on the at least one output node,
wherein the sensor system is configured such that, in operation, the amplifier is powered by at least part of the bias current of the bridge sensor.

2. The sensor system according to claim 1, wherein the amplifier comprises a differential transistor pair and wherein, during operation, the bias current is provided at a common mode point of the amplifier.

3. The sensor system according to claim 2, the at least one output node is a first output node and a second output node and wherein said differential transistor pair comprises a first resistor (Rcm3) between the first input node and the first output node and a second resistor (Rcm4) between the second input node and the second output node.

4. The sensor system according to claim 1, wherein the amplifier comprises a first part and a second part,
wherein the first part is configured for converting the differential sensor signal into a first current and a second current wherein a difference between the currents is indicative for the differential sensor signal,
and wherein the second part is configured for generating, from the first current and the second current, an output voltage which is indicative for the physical quantity.

5. The sensor system according to claim 1, the sensor system comprising
a first voltage level shifter connected between a first terminal of the readout terminal pair and the first input node,
a second voltage level shifter connected between a second terminal of the readout terminal pair and the second input node,
wherein the voltage level shifters are configured for shifting a voltage level of signals of the readout terminal pair before amplifying the differential signal.

6. The sensor system according to claim 5, wherein the voltage level shifters are comprising a first capacitor connected between the first input node and the first terminal of the readout terminal pair and a second capacitor connected between the second input node and the second terminal of the readout terminal pair.

7. The sensor system according to claim 5, the sensor system comprising
a first resistor (Rcm1) connected between the first input node and a reference voltage (Vcmref) or a voltage at the output node of the amplifier
a second resistor (Rcm2) connected between the second input node and a reference voltage (Vcmref) or a voltage at the output node of the amplifier.

8. The sensor system according to claim 1 wherein said sensor system is configured for generating a chopped differential sensor signal, and/or wherein the amplifier comprises choppers for demodulation, and/or wherein the sensor system comprises choppers for demodulating the amplifier output.

9. The sensor system according to claim 1, wherein the bridge sensor is a magnetic sensor.

10. The sensor system according to claim 9, wherein the magnetic sensor is a magnetic Hall sensor, or a tunnel magnetoresistance bridge arrangement, or a giant magnetoresistance bridge arrangement.

11. The sensor system according to any of the claim 1, wherein the bridge sensor is a pressure sensor.

12. The sensor system according to claim 1 wherein the bridge sensor, the current source and the amplifier are integrated in an integrated circuit.

13. The sensor system according to claim 1, the sensor system comprising a plurality of bridge sensors, and configured for biasing the bias terminal pairs of the bridge sensors using the at least one current source and for reading out the readout terminal pairs of the bridge sensors.

14. The sensor system according to claim 13, wherein the bridge sensors are arranged in a matrix configuration.

15. The sensor system according to claim 13, configured for biasing and reading out the plurality of bridge sensors in parallel or in series.

* * * * *